(12) United States Patent
Hatanaka et al.

(10) Patent No.: US 9,905,595 B2
(45) Date of Patent: Feb. 27, 2018

(54) PHOTOELECTRIC SENSOR

(71) Applicant: AZBIL CORPORATION, Chiyoda-ku (JP)

(72) Inventors: Hiroshi Hatanaka, Chiyoda-ku (JP); Minoru Tanaka, Chiyoda-ku (JP)

(73) Assignee: AZBIL CORPORATION, Chiyoda-ku (JP)

( * ) Notice: Subject to any disclaimer, the term of this patent is extended or adjusted under 35 U.S.C. 154(b) by 38 days.

(21) Appl. No.: 15/208,279

(22) Filed: Jul. 12, 2016

(65) Prior Publication Data

US 2017/0018586 A1  Jan. 19, 2017

(30) Foreign Application Priority Data

Jul. 13, 2015  (JP) .................. 2015-139601

(51) Int. Cl.
*H01L 27/146* (2006.01)
*G01S 17/48* (2006.01)
*G01S 7/491* (2006.01)
*G05F 3/02* (2006.01)

(52) U.S. Cl.
CPC ...... *H01L 27/14605* (2013.01); *G01S 7/4913* (2013.01); *G01S 17/48* (2013.01); *G05F 3/02* (2013.01); *H01L 27/14643* (2013.01)

(58) Field of Classification Search
CPC ......... H01L 27/14605; H01L 27/14643; G01S 17/48; G01S 7/4913; G05F 3/02

USPC ....................................... 250/214.1
See application file for complete search history.

(56) References Cited

U.S. PATENT DOCUMENTS

| 5,500,728 | A | | 3/1996 | Nishimoto | |
|---|---|---|---|---|---|
| 6,115,554 | A | * | 9/2000 | Ito | G02B 7/32 396/106 |
| 6,775,010 | B2 | * | 8/2004 | Fujii | G01B 11/2518 345/582 |

FOREIGN PATENT DOCUMENTS

| JP | 07-050569 | 2/1995 |
|---|---|---|
| JP | 7-50569 A | 2/1995 |

* cited by examiner

*Primary Examiner* — Seung C Sohn
(74) *Attorney, Agent, or Firm* — Oblon, McClelland, Maier & Neustadt, L.L.P.

(57) ABSTRACT

A photoelectric sensor includes a current division control circuit that sequentially sets a reference voltage for each current divider circuit along one of the arrangement directions of photodiodes so that the reference voltage for the current divider circuit is equal to or larger than the voltage value of the reference voltage set for a current divider circuit in the preceding stage, and sets one common control voltage for all of the current divider circuits, the common control voltage falling within a range that includes all of the reference voltages.

8 Claims, 9 Drawing Sheets

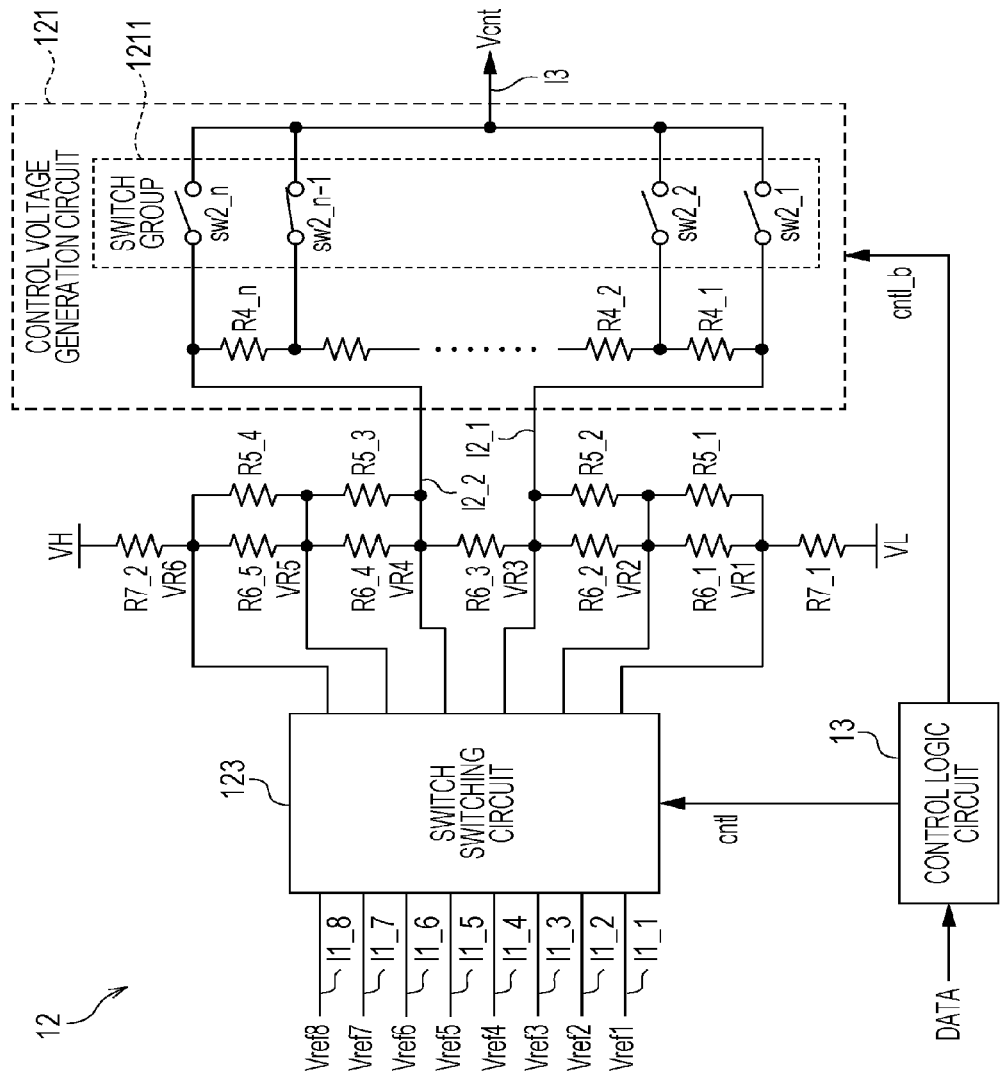

PHOTOELECTRIC SENSOR

CROSS-REFERENCE TO RELATED APPLICATIONS

The present application claims priority to Japanese Application No. 2015-139601, filed Jul. 13, 2015, the entire contents of which are incorporated herein by reference.

BACKGROUND OF THE INVENTION

1. Field of the Invention

The present invention relates to a photoelectric sensor having a detection range for a detection object set by using a set distance, the photoelectric sensor including a multi-segment photodiode in which a plurality of photodiodes are arranged, and a plurality of current divider circuits that are respectively connected to the plurality of photodiodes and each have a current division ratio set in accordance with the difference between a reference voltage and a control voltage.

2. Description of the Related Art

A background suppression (BGS)-type photoelectric sensors is currently available. The BGS-type photoelectric sensor detects the position of a light-receiving spot on a multi-segment photodiode to thereby detect the distance to a detection object and determine the presence or absence of a detection object that is present at a distance less than a certain set distance. A photoelectric sensor of this type that detects the position of a light-receiving spot with high accuracy by using current divider circuits is available (see Japanese Unexamined Patent Application Publication No. 7-50569, for example). The photoelectric sensor disclosed by Japanese Unexamined Patent Application Publication No. 7-50569 changes voltages for setting the current division ratios of the current divider circuits by using an external potentiometer.

However, the related-art photoelectric sensor disclosed by Japanese Unexamined Patent Application Publication No. 7-50569 changes the voltages for setting the current division ratios by using an external potentiometer, and therefore, it is not possible to digitally adjust the current division ratios. Accordingly, it is not possible to set the current division ratios efficiently with high accuracy, which is a shortcoming.

SUMMARY OF THE INVENTION

The present invention has been made in order to address the above-described shortcoming and provides a photoelectric sensor including current divider circuits in which the current division ratios of the current divider circuits can be set more efficiently with higher accuracy compared to the related-art configuration.

A photoelectric sensor according to one aspect of the present invention is a photoelectric sensor having a detection range for a detection object set by using a set distance, the photoelectric sensor including a multi-segment photodiode, a plurality of current divider circuits, and a current division control circuit. In the multi-segment photodiode, a plurality of photodiodes are arranged. The plurality of current divider circuits are respectively connected to the plurality of photodiodes, and each have a current division ratio set in accordance with a difference between a reference voltage and a control voltage. The current division control circuit sequentially sets the reference voltage for each current divider circuit among the plurality of current divider circuits along one of arrangement directions of the photodiodes so that the reference voltage for the current divider circuit is equal to or larger than a voltage value of the reference voltage set for a current divider circuit in an immediately preceding stage among the plurality of current divider circuits, and sets the control voltage, which is one common control voltage, for all of the plurality of current divider circuits, the common control voltage falling within a range that includes all of the reference voltages.

According to one aspect of the present invention, in the photoelectric sensor including current divider circuits as configured above, the current division ratios of the current divider circuits can be set more efficiently with higher accuracy compared to the related-art configuration.

BRIEF DESCRIPTION OF THE DRAWINGS

FIG. 6 is a diagram illustrating an example configuration of the current division control circuit in a second embodiment of the present invention;

DESCRIPTION OF THE PREFERRED EMBODIMENTS

Hereinafter, embodiments of the present invention will be described in detail with reference to the drawings.

First Embodiment

Figure 1:
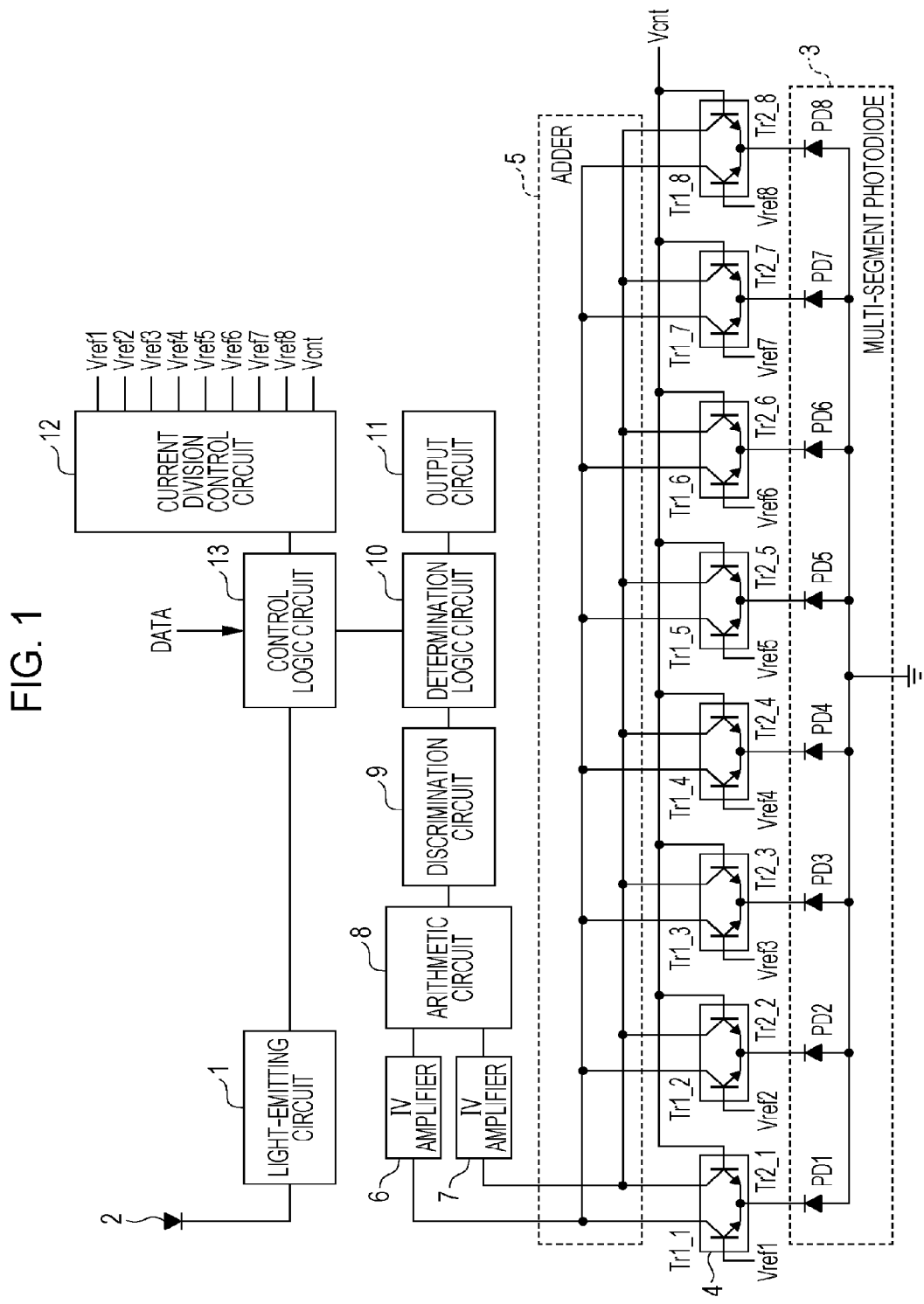
FIG. 1 is a diagram illustrating an example configuration of a photoelectric sensor according to a first embodiment of the present invention.

FIG. 1 is a diagram illustrating an example configuration of a photoelectric sensor according to a first embodiment of the present invention.

The photoelectric sensor is a distance-setting-type photoelectric sensor having a detection range for a detection object set by using a set distance. Hereinafter, description is given while assuming that the photoelectric sensor is a BGS-type photoelectric sensor that detects a detection object present at a distance less than the set distance, for example. The photoelectric sensor includes a light-emitting circuit 1, a light-emitting device 2, a multi-segment photodiode 3, current divider circuits 4, an adder 5, an IV amplifier 6, an IV amplifier 7, an arithmetic circuit 8, a discrimination circuit 9, a determination logic circuit 10, an output circuit 11, a current division control circuit 12, and a control logic circuit 13, as illustrated in FIG. 1.

The light-emitting circuit 1 generates a current to be supplied to the light-emitting device 2 in accordance with a light emission timing communicated from the control logic circuit 13.

The light-emitting device 2 is driven by the current generated by the light-emitting circuit 1 and emits light. As the light-emitting device 2, a light-emitting diode (LED) is used, for example. The light emitted from the light-emitting device 2 is incident on a detection area. In a case where a detection object is present in the detection area, the light is reflected by the detection object.

In the multi-segment photodiode 3, a plurality of photodiodes PD are arranged that each receive the light reflected by the detection object present in the detection area and convert the light into an electric signal (current). With the multi-segment photodiode 3, the position of a light-receiving spot can be detected. The following description assumes a case where the multi-segment photodiode 3 is constituted by eight photodiodes PD1 to PD8.

The current divider circuits 4 are respectively connected to the photodiodes PD that constitute the multi-segment photodiode 3, and each divide the electric signal (current) from a corresponding one of the photodiodes PD into a first current and a second current. The current divider circuits 4 each have a current division ratio that is set in accordance with a reference voltage and a control voltage output from the current division control circuit 12. The current divider circuits 4 each include a transistor Tr1 (a corresponding one of Tr1_1 to Tr1_8) and a transistor Tr2 (a corresponding one of Tr2_1 to Tr2_8) that constitute a differential pair, as illustrated in FIG. 1. The transistor Tr1 has an emitter terminal that is connected to the output end of a corresponding one of the photodiodes PD, a collector terminal that is connected to the input end of the IV amplifier 6, and a base terminal that is connected to the output end of a corresponding one of the reference voltages from the current division control circuit 12 (a corresponding one of the reference voltage output lines 11 illustrated in FIG. 4). The transistor Tr2 has an emitter terminal that is connected to the output end of a corresponding one of the photodiodes PD, a collector terminal that is connected to the input end of the IV amplifier 7, and a base terminal that is connected to the output end of the control voltage from the current division control circuit 12 (the control voltage output line 13 illustrated in FIG. 4).

The adder 5 adds together the first currents divided by the respective current divider circuits 4 and adds together the second currents divided by the respective current divider circuits 4.

The IV amplifier 6 converts the sum of the first currents obtained by the adder 5 into a voltage.

The IV amplifier 7 converts the sum of the second currents obtained by the adder 5 into a voltage.

The arithmetic circuit 8 amplifies the voltages that are respectively converted by the IV amplifiers 6 and 7 and calculates the voltage difference. The arithmetic circuit 8 also performs noise reduction on a signal that indicates the calculated voltage difference.

The discrimination circuit 9 converts the signal (analog signal) that indicates the voltage difference calculated by the arithmetic circuit 8 into a binary signal (H or L).

The determination logic circuit 10 takes in the binary signal converted by the discrimination circuit 9 in accordance with a take-in timing communicated from the control logic circuit 13 and digitally performs signal processing on the binary signal to thereby determine the presence or absence of a detection object in the detection range.

As a method of signal processing on the binary signal converted by the discrimination circuit 9, the determination logic circuit 10 uses a digital integration scheme (up/down count scheme), for example. That is, an up/down counter is provided in the determination logic circuit 10, and the up/down counter is incremented when the signal taken from the discrimination circuit 9 is an H signal and is decremented when the signal is an L signal. In a case where an up/down counter having ten levels is used, for example, it is determined that no light is received when the count value is equal to zero, it is determined that light is received (light-receiving state) when the count value is equal to 10, and the previous state is maintained when the count value is a value between zero and 10. Accordingly, noise immunity can be improved. Specifically, if noise or the like is present, it is not always the case that H signals are successively received even in the light-receiving state and an L signal may be occasionally received. However, as long as the counter value of the up/down counter does not become zero, determination of the light-receiving state is maintained. Accordingly, erroneous determination can be suppressed.

The output circuit 11 externally outputs the result of determination by the determination logic circuit 10.

The current division control circuit 12 sets the reference voltages and the control voltage for the respective current divider circuits 4 in accordance with control signals output from the control logic circuit 13. At this time, the current division control circuit 12 sequentially sets the reference voltage for each current divider circuit 4 along one of the arrangement directions of the photodiodes PD so that the reference voltage for the current divider circuit 4 is equal to or larger than the voltage value of the reference voltage set for the current divider circuit 4 in the preceding stage, and sets one common control voltage for all of the current divider circuits 4, the common control voltage falling within a range that includes all of the reference voltages. With the current division control circuit 12, the current division ratio of each current divider circuit 4 can be controlled. An example configuration of the current division control circuit 12 is described below. The current division control circuit 12 is configured by software-based program processing using a central processing unit (CPU).

The control logic circuit 13 controls each unit in the photoelectric sensor. The control logic circuit 13 has a function of setting and communicating to the light-emitting circuit 1 the light emission timing, a function of setting and communicating to the determination logic circuit 10 the take-in timing at which a signal is to be taken from the discrimination circuit 9, and a function of outputting the control signals for controlling the current division control circuit 12.

In the following description, the control logic circuit 13 sets a current division position on the basis of data from an external microcomputer or the like and generates the control signals for the current division control circuit 12.

Now, description of an operation principle of the photoelectric sensor that is configured as described above is given with reference to FIG. 2 and FIGS. 3A and 3B. Note that the example illustrated in FIG. 2 and FIGS. 3A and 3B illustrates a case where photodiodes PD having a width of 1 mm and a length of 0.3 mm are used.

Figure 2:
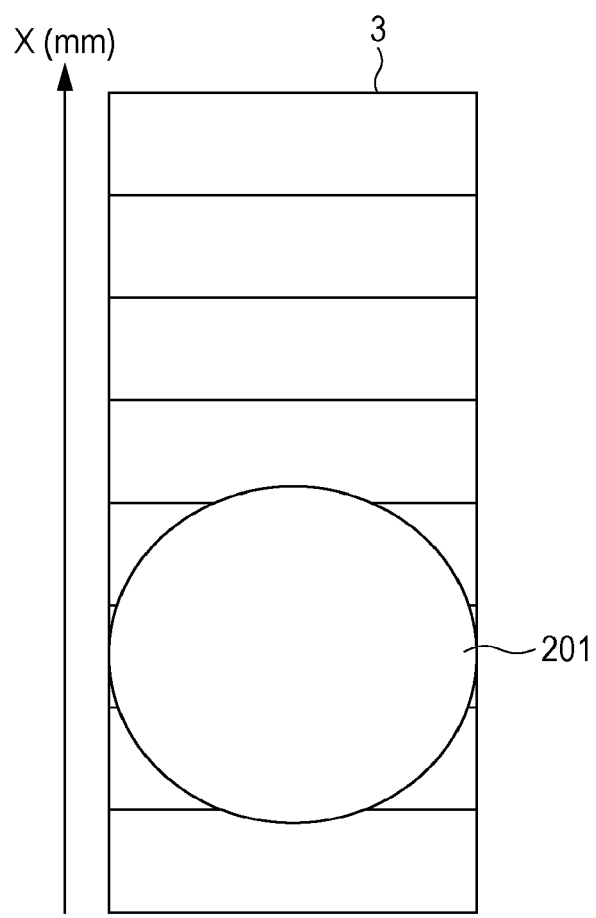
FIG. 2 is a diagram illustrating an example relationship between a multi-segment photodiode and a light-receiving spot in the first embodiment of the present invention.

In the photoelectric sensor, when light is emitted from the light-emitting device 2 to a detection area and the light is reflected by a detection object present in the detection area, the light is received by the multi-segment photodiode 3 (on a light-receiving spot 201) as illustrated in FIG. 2, for example. To the photodiodes PD that constitute the multi-segment photodiode 3, the current divider circuits 4 are respectively connected. On the basis of the difference between the base voltages of the transistors Tr1 and Tr2 that constitute each current divider circuit 4, the current that flows through the corresponding photodiode PD can be divided into the first current to be diverted into the IV amplifier 6 and the second current to be diverted into the IV amplifier 7. The first currents divided by the respective current divider circuits 4 are added together and the sum of the first currents is converted into a voltage by the IV amplifier 6, and the second currents divided by the respective current divider circuits 4 are added together and the sum of the second currents is converted into a voltage by the IV amplifier 7. Thereafter, the voltage difference between the voltages is detected by the arithmetic circuit 8. The position of the light-receiving spot 201 on the multi-segment photodiode 3 changes in accordance with the distance to the detection object. Therefore, with the above-described voltage difference, it is possible to detect a detection object on the basis of the distance instead of the amount of light.

Figure 3A:
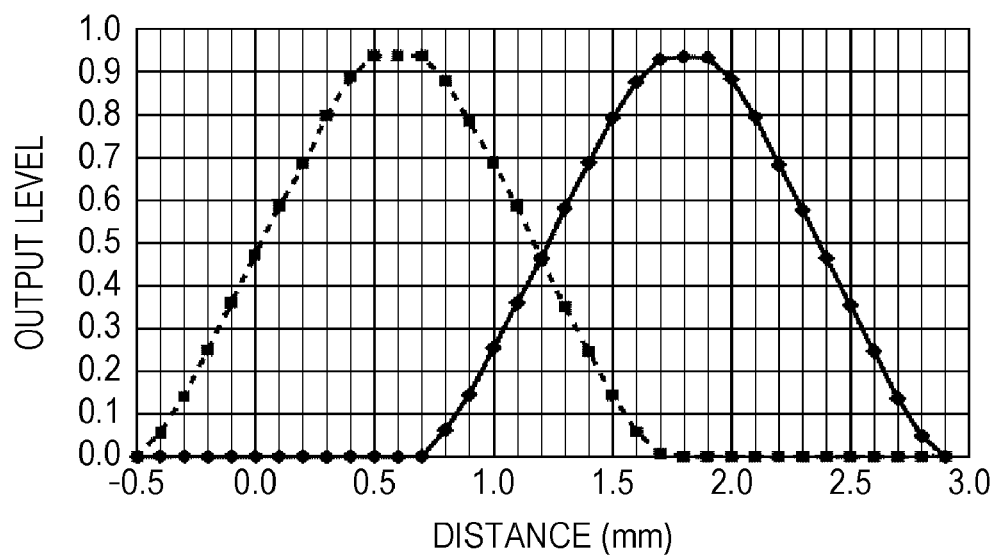
FIGS. 3A and 3B are diagrams for describing an operation principle of the photoelectric sensor according to the first embodiment of the present invention.
Figure 3B:
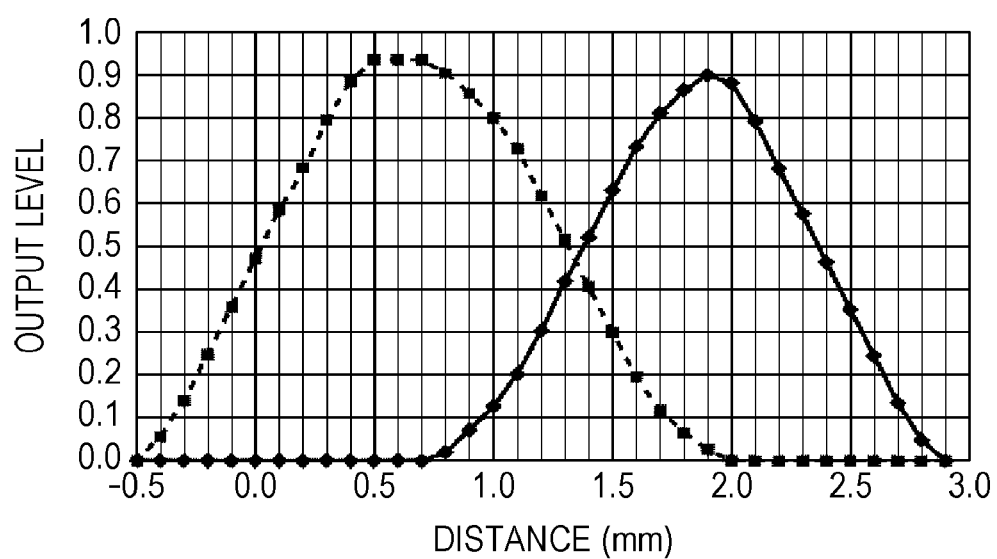

A relationship between the output v1 (represented by a solid line) of the IV amplifier 6 and the output v2 (represented by a dashed line) of the IV amplifier 7 when the position of the light-receiving spot 201 on the multi-segment photodiode 3 moves in the x direction illustrated in FIG. 2 is illustrated in FIGS. 3A and 3B. Note that, in FIGS. 3A and 3B, the reference voltages of the current divider circuits 4 illustrated in FIG. 1 are set in increments of 0.2 V (Vref1=1.0 V, Vref2=1.2 V, . . . , Vref8=2.4 V). The control voltage Vcnt is set to 1.7 V in FIG. 3A, and the control voltage Vcnt is set to 1.8 V in FIG. 3B.

In FIGS. 3A and 3B, when v1 is equal to v2, the light-receiving spot 201 is positioned at a distance of 1.2 mm in the case of Vcnt=1.7 V and is positioned at a distance of about 1.35 mm in the case of Vcnt=1.8 V. Here, in the BGS-type photoelectric sensor, in the case of Vcnt=1.7 V, it is determined that a detection object is present when the light-receiving spot 201 is positioned at a distance less than 1.2 mm and that a detection object is not present when the light-receiving spot 201 is positioned at a distance more than 1.2 mm even if the reflection light is intense. In the case of Vcnt=1.8 V, it is determined that a detection object is present when the light-receiving spot 201 is positioned at a distance less than 1.35 mm and that a detection object is not present when the light-receiving spot 201 is positioned at a distance more than 1.35 mm even if the reflection light is intense. Accordingly, by changing the control voltage, the detection range for a detection object can be adjusted.

In the above-described example, although the photodiodes PD have a length of 0.3 mm, it is possible to detect the difference in a case where the position of the light-receiving spot 201 changes and is positioned at the distance of 1.35 mm from the distance of 1.2 mm. That is, by using the current divider circuits 4, the set interval for the detection range can be set to a range smaller than the length of the photodiodes PD, and the resolution can be increased accordingly.

Now, an example configuration of the current division control circuit 12 that sets the reference voltages and the control voltage based on which the current division ratios of the respective current divider circuits 4 are determined is described with reference to FIG. 4. Note that FIG. 4 illustrates an example configuration of the current division control circuit 12 that serves eight current divider circuits 4.

Figure 4:
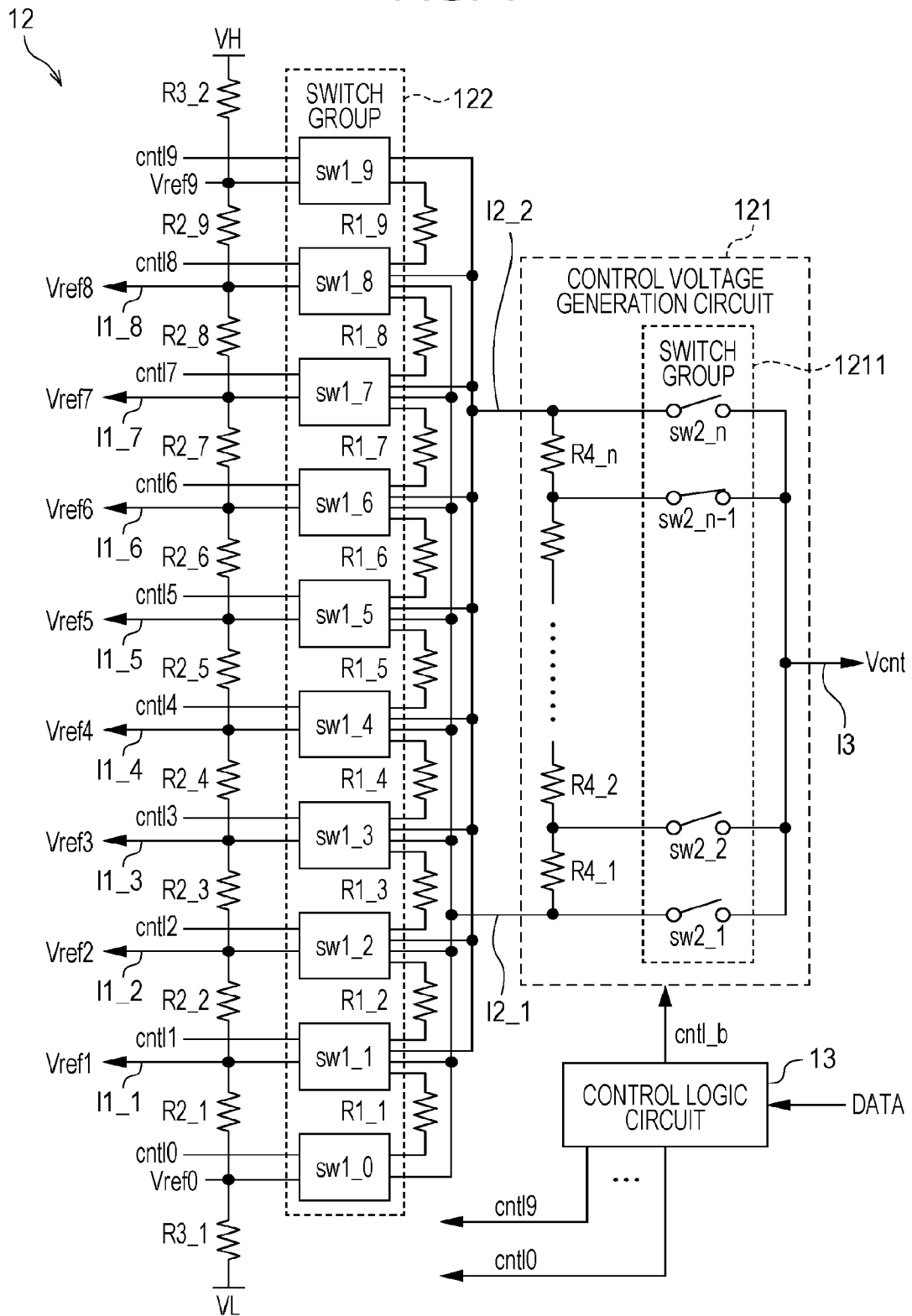
FIG. 4 is a diagram illustrating an example configuration of a current division control circuit in the first embodiment of the present invention.

The current division control circuit 12 includes a plurality of reference voltage generation resistors R1 (R1_1 to R1_9), a plurality of reference voltage output lines 11 (11_1 to 11_8), a control voltage generation circuit 121, a switch group 122 constituted by a plurality of switches sw1 (sw1_0 to sw1_9), a plurality of resistors R2 (R2_1 to R2_9), and two resistors R3 (R3_1 and R3_2), as illustrated in FIG. 4.

The reference voltage generation resistors R1 are connected in series between two voltages (VH and VL). With the plurality of reference voltage generation resistors R1, voltage division on the basis of the two voltages is performed. In a case k current divider circuits 4 are provided, k+1 reference voltage generation resistors R1 are provided. The reference voltage generation resistors R1 that are used have the same resistance.

The values of VH and VL are set to values appropriate to the circuit operation. That is, the values of VH and VL are set so as to match a voltage range for normal operations upon input to and output from the current divider circuits 4 and the IV amplifies 6 and 7.

To the transistors Tr1 and Tr2 of each current divider circuit 4, a circuit (transistor) not illustrated is connected through which a bias current for ensuring a response speed flows. For a normal operation of the circuit thorough which the bias current flows, the reference voltages Vref and the control voltage Vcnt need to have a value of 1.4 V or more ($2 \times V_{BE}$ (base-emitter voltage)≅1.4). Therefore, if the eight photodiodes PD are used as in the embodiments of the present invention and the reference voltage difference between the adjacent photodiodes PD is 0.1 V, the voltage at the input terminals of the IV amplifiers 6 and 7 needs to be set to a value equal to or larger than 2.2 V (1.4+0.1×8=2.2). Otherwise, the current divider circuits 4 may be in the saturation region and may fail to operate normally. The input voltage range of the IV amplifiers 6 and 7 has an upper limit, and it is not possible to set the input voltage to a very high value. Therefore, the reference voltages Vref and the control voltage Vcnt need to be determined by taking into consideration the above-described conditions, and the values of VH and VL are also determined by taking into consideration the conditions.

The reference voltage output lines 11 are used to output voltages divided by the reference voltage generation resistors R1 as reference voltages. In FIG. 4, one end of each of the reference voltage output lines 11 is connected between corresponding ones of the reference voltage generation resistors R1, and the other end thereof is connected to the base terminal of the transistor Tr1 of a corresponding one of the current divider circuits 4.

The control voltage generation circuit 121 has the function of the reference voltage generation resistors R1 and a function of generating the control voltage that falls between the connected voltages. An example configuration of the control voltage generation circuit 121 is described below.

The switch group 122 is used to replace one of the reference voltage generation resistors R1 with the control voltage generation circuit 121 in accordance with control signals (cnt10 to cnt19) from the control logic circuit 13.

The resistors R2 are respectively connected in parallel to the reference voltage generation resistors R1. Note that the resistors R2 that are used have the same resistance, which is equal to about one-tenth of the resistance of the reference voltage generation resistors R1.

The resistors R3 are respectively connected in series to the reference voltage generation resistors R1 that are positioned at the respective ends.

Now, the configuration of the control voltage generation circuit 121 is described.

The control voltage generation circuit 121 includes a pair of connection lines 12 (12_1 and 12_2), a plurality of control voltage generation resistors R4 (R4_1 to R4_n), a switch group 1211 constituted by a plurality of switches sw2 (sw2_1 to sw2_n), and a control voltage output line 13.

When one of the reference voltage generation resistors R1 is replaced with the control voltage generation circuit 121 in accordance with an operation of the switch group 122, one end of one of the connection lines 12 is connected to one of the reference voltage generation resistors R1 adjacent to the replaced reference voltage generation resistor R1, and one end of the other connection line 12 is connected to the other reference voltage generation resistor R1 adjacent to the replaced reference voltage generation resistor R1.

The control voltage generation resistors R4 are connected in series between the connection lines 12. With the plurality of control voltage generation resistors R4, the voltage between the connection lines 12 is divided. Note that the sum of the resistances of the control voltage generation resistors R4 is made equal to the resistance of the reference voltage generation resistors R1. By using the control voltage generation resistors R4, the adjustment step for the control voltage is made smaller.

The switch group 1211 is used to select one of the voltages divided by the control voltage generation resistors R4 as the control voltage in accordance with a control signal (cntl_b) from the control logic circuit 13.

The control voltage output line 13 is used to output the control voltage selected by the switch group 1211 to the base terminal of the transistor Tr2 of each of the current divider circuits 4. One end of the control voltage output line 13 is connected to the output end of each of the switches sw1 that constitute the switch group 1211, and the other end thereof is connected to the base terminal of the transistor Tr2 of each of the current divider circuits 4.

The control logic circuit 13 outputs the control signals cnt10 to cntl9 for the switch group 122 and outputs the control signal cntl_b for the switch group 1211. Note that, in FIG. 4, the control signals cntl1 to cntl8 are assumed to be signals having two bits or more because there are three states which the switches sw1_1 to sw1_8 may enter, and the control signals cnt10 and cnt19 are assumed to be signals having one bit or more because there are two states which the switches sw1_0 to sw_9 may enter.

Figure 5:
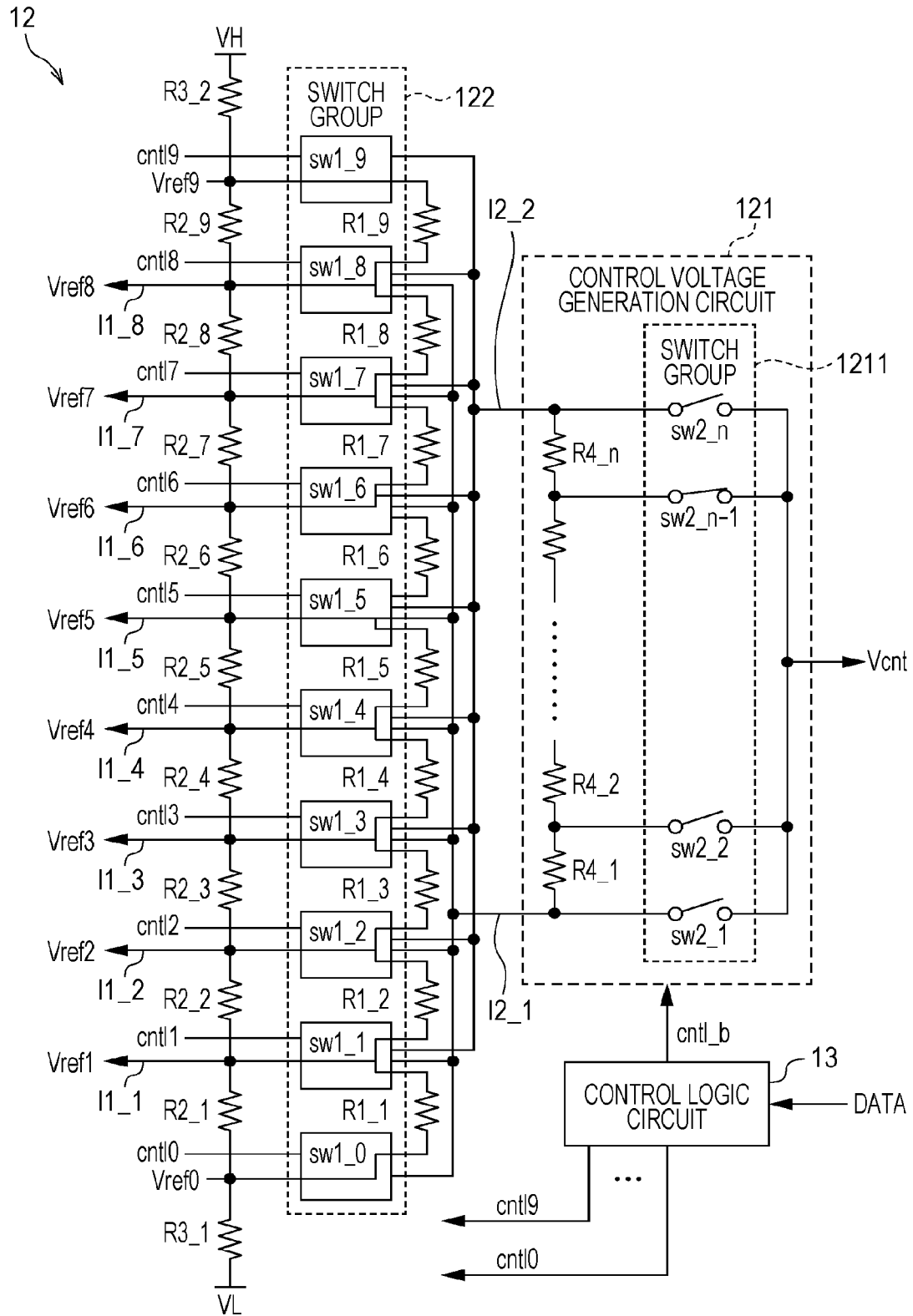
FIG. 5 is a diagram illustrating an example operation of the current division control circuit in the first embodiment of the present invention.

Here, the reference voltage generation resistor R1 6 is disconnected and the control voltage generation circuit 121 is connected instead in accordance with operations of the switches sw1_5 and sw1_6, for example, as illustrated in FIG. 5. In this case, the control voltage generation circuit 121 is connected instead of the reference voltage generation resistor R1_6 in series between the other reference voltage generation resistors R1. As a result, a voltage between Vref5 and Vref6 can be selected as the control voltage.

In the current division control circuit 12 illustrated in FIG. 4, a voltage Vref9 that is higher than the reference voltages Vref1 to Vref8 respectively used by the current divider circuits 4 and a voltage Vref0 that is lower than the reference voltages Vref1 to Vref8 are set, and the control voltage generation circuit 121 can select the control voltage from within a range between the voltage Vref0 and the voltage Vref9. Accordingly, it is possible to maximize the range within which the set distance can be set.

As described above, according to the first embodiment, the current division control circuit 12 is provided that sequentially sets the reference voltage for each current divider circuit 4 along one of the arrangement directions of the photodiodes PD so that the reference voltage for the current divider circuit 4 is equal to or larger than the voltage value of the reference voltage set for the current divider circuit 4 in the preceding stage, and that sets one common control voltage for all of the current divider circuits 4, the common control voltage falling within a range that includes all of the reference voltages. Therefore, the reference voltages and the control voltage can be digitally adjusted, and it is possible to set the current division ratios of the current divider circuits 4 more efficiently with higher accuracy in the photoelectric sensor including the current divider circuits 4 compared to the related-art configuration.

In the configuration illustrated in FIG. 4, the resistance of the reference voltage generation resistors R1 needs to be set to a sufficiently large value relative to the on-resistance of the switches sw1 that constitute the switch group 122. However, if the resistance of the reference voltage generation resistors R1 is increased, the impedances of the reference voltages increase, and the error becomes larger. Therefore, the resistors R2 are respectively connected in parallel to the reference voltage generation resistors R1 in the embodiments of the present invention. Accordingly, even if the resistance of the reference voltage generation resistors R1 is increased, the impedances of the reference voltages can be decreased, and the impact on the base currents flowing through the connected current divider circuits 4 can be reduced.

In the embodiments of the present invention, data based on which output is turned on is determined while data input to the control logic circuit 13 is scanned by using an external microcomputer or the like (tuning), the determined data is input as set data for the control logic circuit 13, and the control logic circuit 13 uses the input data to thereby adjust the reference voltages and the control voltage based on which the current division ratios of the current divider circuits 4 are determined. As a result, automatic setting (auto-tuning) is enabled, and a detection object that is present at a distance less than the distance set upon tuning can be detected. Further, setting accuracy can be increased, and reproducibility can be ensured accordingly.

Each of the current divider circuits 4 operates in accordance with the difference between the base voltages of the two transistors Tr1 and Tr2, which constitute a differential pair. Accordingly, by setting the control voltage and the reference voltages on the basis of the same set of voltages so as to fall between the voltages, the circuit can be less affected by fluctuations or the like in the voltages.

Note that a method for setting the set interval between the reference voltages is not mentioned in the above description. The current divider circuits 4 each have a property such that, if the difference between the base voltages of the transistors Tr1 and Tr2 exceeds 0.2 V, most of the current from the photodiode PD flows through the transistor having a higher base voltage. Therefore, the set interval between the reference voltages may be set to a value between 0.05 V and 0.2 V, for example.

Second Embodiment

In a second embodiment, another example configuration of the current division control circuit 12 is described with reference to FIG. 6. In the example illustrated in FIG. 6, an example configuration of the current division control circuit 12 that serves eight current divider circuits 4 is illustrated.

The current division control circuit 12 in the second embodiment includes a plurality of reference voltage generation resistors R5 (R5_1 to R5_4), the control voltage generation circuit 121, a switch switching circuit 123, the plurality of reference voltage output lines 11 (11_1 to 11_8), a plurality of resistors R6 (R6_1 to R6_5), and two resistors R7 (R7_1 and R7_2), as illustrated in FIG. 6.

The reference voltage generation resistors R5 are connected in series between the two voltages (VH and VL). The number of the reference voltage generation resistors R5 that are provided is smaller than the number of the current divider circuits 4. Note that the reference voltage generation resistors R5 that are used have the same resistance.

The control voltage generation circuit 121 is connected in series to or between the reference voltage generation resistors R5 and has the function of the reference voltage generation resistors R5 and the function of generating the control voltage that falls between the connected voltages. The control voltage generation circuit 121 may be connected to any position between the above-described two voltages. With the plurality of reference voltage generation resistors R5 and the control voltage generation circuit 121, voltage division on the basis of the two voltages is performed. Note that the configuration of the control voltage generation circuit 121 is similar to the configuration illustrated in FIG. 4, and description thereof is omitted.

The switch switching circuit 123 distributes the voltages divided by the reference voltage generation resistors R5 and the control voltage generation circuit 121 as the reference voltages for the respective current divider circuits 4 in accordance with a control signal (cntl) from the control logic circuit 13.

The reference voltage output lines 11 are used to output the reference voltages distributed by the switch switching circuit 123 to the current divider circuits 4 respectively. One end of each of the reference voltage output lines 11 is connected to a corresponding one of the output ends of the switch switching circuit 123, and the other end thereof is connected to the base terminal of the transistor Tr1 of a corresponding one of the current divider circuits 4.

One of the resistors R6 is connected in parallel to the control voltage generation circuit 121 and the other resistors R6 are respectively connected in parallel to the reference voltage generation resistors R5. Note that the resistors R6 that are used have the same resistance, which is equal to about one-tenth of the resistance of the reference voltage generation resistors R5.

The resistors R7 are respectively connected in series to the reference voltage generation resistors R5 that are positioned at the respective ends (or one of the resistors R7 is connected in series to the control voltage generation circuit 121 if the control voltage generation circuit 121 is positioned at one of the ends).

The control logic circuit 13 outputs the control signal cntl for the switch switching circuit 123 and the control signal cntl_b for the switch group 1211.

In the current division control circuit 12 illustrated in FIG. 6, as the reference voltages Vref1 to Vref8 for the eight current divider circuits 4, voltages are selected from among six voltages VR1 to VR6. As the control voltage Vcnt, a voltage between the voltage VR3 and the voltage VR4 is selected.

In a case where the voltage interval between the reference voltages is set to 0.1 V in the current division control circuit 12 according to the first embodiment illustrated in FIG. 4, an operation similar to that in the first embodiment can be performed by setting the voltage interval between adjacent voltages among the voltage VR1 to the voltage VR6 to 0.1 V in the current division control circuit 12 according to the second embodiment illustrated in FIG. 6.

The current divider circuits 4 each have a property such that, if the difference between the base voltages of the transistors Tr1 and Tr2 reaches or exceeds 0.2 V, most of the current from the photodiode PD flows through one of the transistors. Therefore, in a case where the current divider circuit 4 having the base voltage difference of 0.2 V and the current divider circuit 4 having the base voltage difference of 0.3 V are present, even if the reverence voltages are changed so that both the base voltage differences are equal to 0.2 V, the error in the result of current division is at a level that requires no attention. Therefore, the reference voltages that are apart from the control voltage by 0.2 V or more can be set to the same value.

A case is assumed where the reference voltage generation resistor R1_5 is replaced with the control voltage generation circuit 121 in the current division control circuit 12 according to the first embodiment illustrated in FIG. 4, for example. In this case, the control voltage is a voltage between Vref4 and Vref5. Therefore, as illustrated in FIG. 7A, in the current divider circuits 4 to which the reference voltages Vref8 and Vref1 are applied respectively, even if the reference voltage Vref8 is changed to Vref7 and the reference voltage Vref1 is changed to Vref2, the values of the divided currents consequently remain substantially unchanged.

Figure 7A:
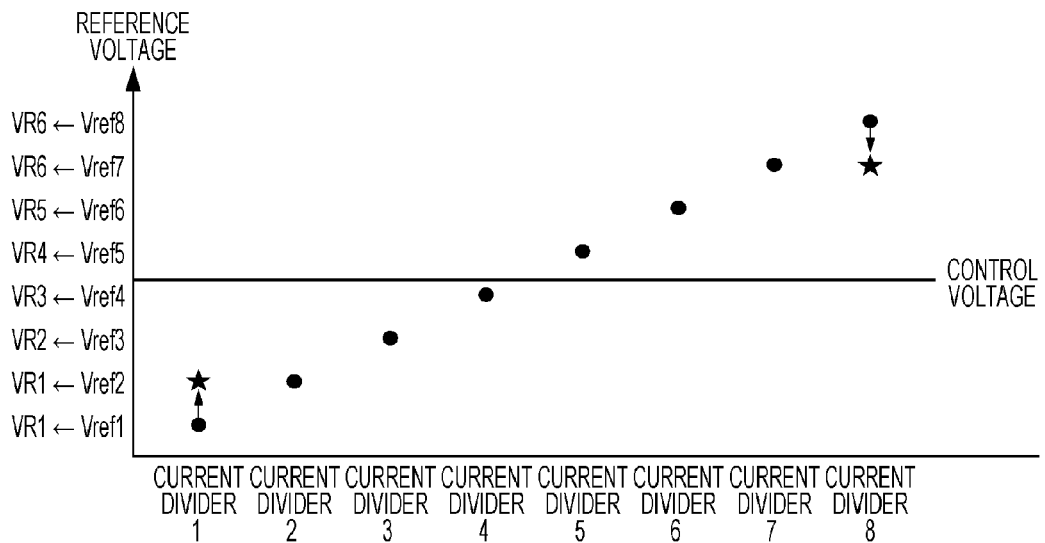
FIGS. 7A and 7B are diagrams for describing an operation principle of the current division control circuit in the second embodiment of the present invention.
Figure 7B:
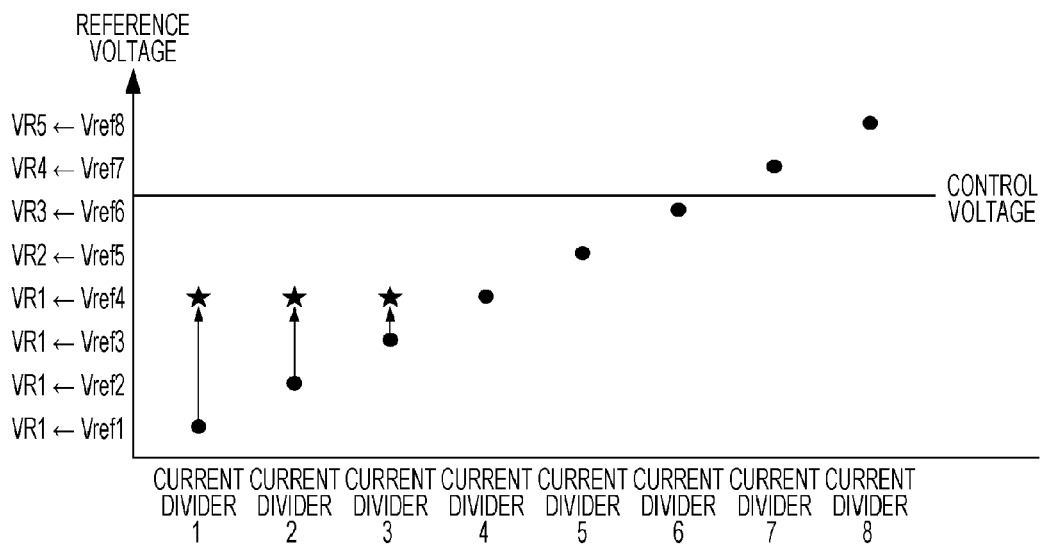

Similarly, in a case where the control voltage is a voltage between Vref6 and Vref7, even if the reference voltages Vref1 to Vref3 are changed to Vref4 as illustrated in FIG. 7B, the errors in the result are at a level that requires no attention.

Therefore, in the case illustrated in FIG. 7A, the switch switching circuit 123 is controlled to set the reference voltages so that Vref1=Vref2=VR1, Vref3=VR2, Vref4=VR3, Vref5=VR4, Vref6=VR5, and Vref7=Vref8=VR6 are satisfied. Consequently, the same result of current division as that in the first embodiment can be obtained.

In the case illustrated in FIG. 7B, the switch switching circuit 123 is controlled to set the reference voltages so that Vref1=Vref2=Vref3=Vref4=VR1, Vref5=VR2, Vref6=VR3, Vref7=VR4, and Vref8=VR5 are satisfied. Consequently, the same result of current division as that in the first embodiment can be obtained.

In the above description, the case where the voltage interval between the reference voltages is set to 0.1 V is described. In a case where the voltage interval is larger than 0.1 V, it may be possible to distribute the reference voltages to the eight current divider circuits 4 using the four levels of the voltages VR1 to Vr4.

In the above description, the case where the resistances of the reference voltage generation resistors R5 are made equal to one another and the resistances of the resistors R6 are made equal to one another is described. However, the embodiments of the present invention are not limited to the case. Even if the resistances of the reference voltage generation resistors R5 are not equal to one another and the resistances of the resistors R6 are not equal to one another, the current division operation is performed. However, the result obtained in this case is different from the case where the resistances are made equal to one another.

As described above, according to the second embodiment, the configuration is employed in which some of the reference voltages for the current divider circuits 4 are set to the same value by taking advantage of the property of the current divider circuits 4. Therefore, the effect attained by the first embodiment is also attained, and the circuit scale can be reduced. Further, the voltages used to generate the reference voltages and the control voltage can be decreased.

Third Embodiment

In a third embodiment, another example configuration of the control voltage generation circuit 121 is described with reference to FIG. 8.

Figure 8:
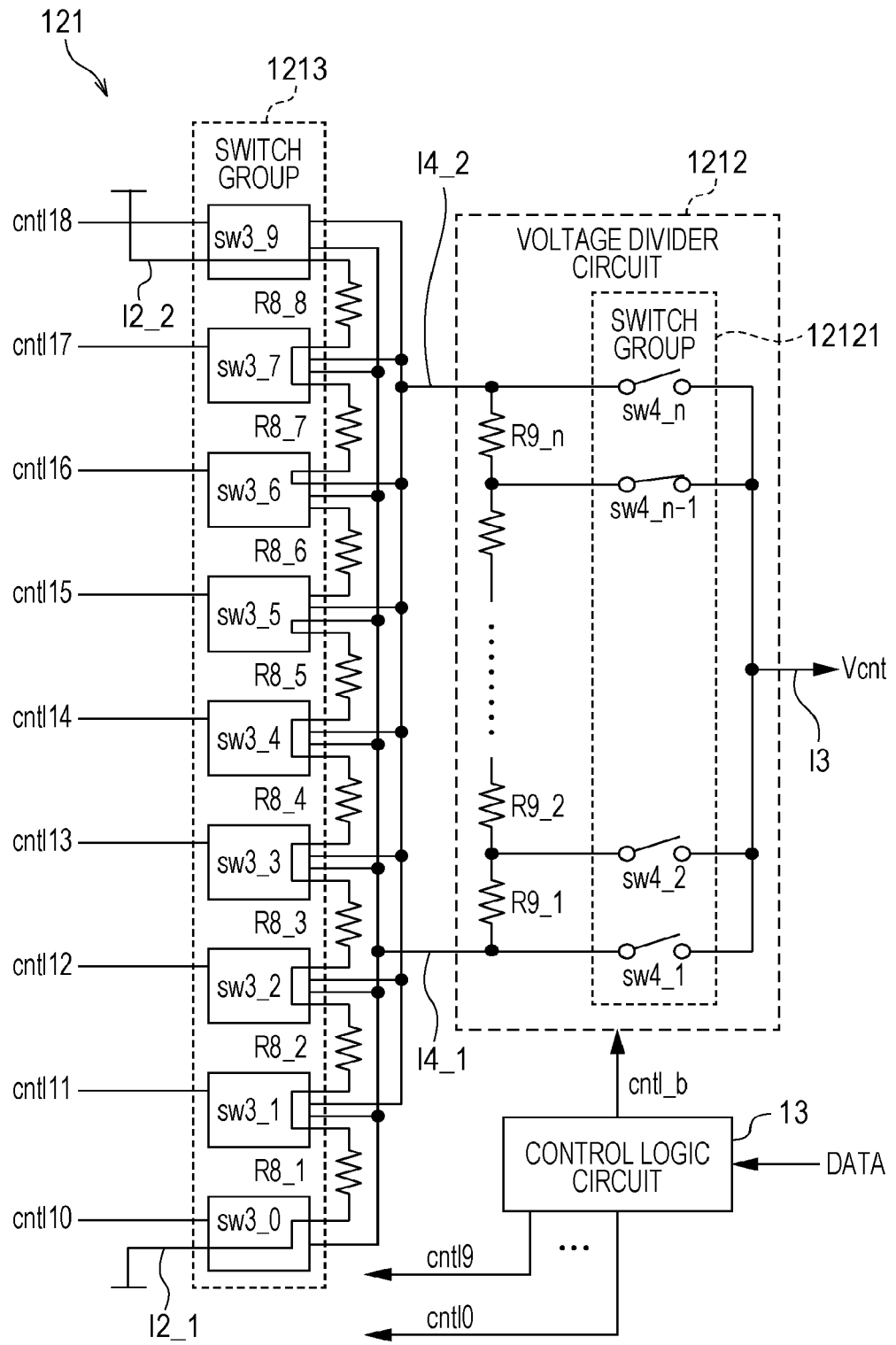
FIG. 8 is a diagram illustrating an example configuration of a control voltage generation circuit in a third embodiment of the present invention.

The control voltage generation circuit 121 in the third embodiment includes the pair of connection lines 12 (12_1 and 12_2), a plurality of first control voltage generation resistors R8 (R8_1 to R8_8), a voltage divider circuit 1212, and a switch group 1213 constituted by a plurality of switches sw3 (sw3_0 to sw3_9), as illustrated in FIG. 8. A case where the control voltage generation circuit 121 is applied to the current division control circuit 12 according to the first embodiment is described below.

When one of the reference voltage generation resistors R1 is replaced with the control voltage generation circuit 121 in accordance with an operation of the switch group 122, one end of one of the connection lines 12 is connected to one of the reference voltage generation resistors R1 adjacent to the replaced reference voltage generation resistor R1, and one end of the other connection line 12 is connected to the other reference voltage generation resistor R1 adjacent to the replaced reference voltage generation resistor R1.

The first control voltage generation resistors R8 are connected in series between the connection lines 12. With the plurality of first control voltage generation resistors R8, the voltage between the connection lines 12 is divided. Note that the sum of the resistances of the first control voltage generation resistors R8 is made equal to the resistance of the reference voltage generation resistors R1. By using the first control voltage generation resistors R8, the adjustment step for the control voltage can be made smaller.

The voltage divider circuit 1212 has the function of the first control voltage generation resistors R8 and the function of generating the control voltage that falls between the connected voltages. An example configuration of the voltage divider circuit 1212 is described below.

The switch group 1213 is used to replace one of the first control voltage generation resistors R8 with the voltage divider circuit 1212 in accordance with control signals (cntl10 to cntl18) from the control logic circuit 13.

Now, the configuration of the voltage divider circuit 1212 is described.

The voltage divider circuit 1212 includes a pair of connection lines 14 (14_1 and 14_2), a plurality of second control voltage generation resistors R9 (R9_1 to R9_*n*), a switch group 12121 constituted by a plurality of switches sw4 (sw4_1 to sw4_*n*), and the control voltage output line 13.

When one of the first control voltage generation resistors R8 is replaced with the voltage divider circuit 1212 in accordance with an operation of the switch group 1213, one end of one of the connection lines 14 is connected to one of the first control voltage generation resistors R8 adjacent to the replaced first control voltage generation resistor R8, and one end of the other connection line 14 is connected to the other first control voltage generation resistor R8 adjacent to the replaced first control voltage generation resistor R8.

The second control voltage generation resistors R9 are connected in series between the connection lines 14. With the plurality of second control voltage generation resistors R9, the voltage between the connection lines 14 is divided. Note that the sum of the resistances of the second control voltage generation resistors R9 is made equal to the resistance of the first control voltage generation resistors R8. By using the second control voltage generation resistors R9, the adjustment step for the control voltage can be further made smaller.

The switch group 12121 is used to select one of the voltages divided by the second control voltage generation resistors R9 as the control voltage in accordance with the control signal (cntl_b) from the control logic circuit 13.

The control voltage output line 13 is used to output the control voltage selected by the switch group 12121 to the base terminal of the transistor Tr2 of each of the current divider circuits 4. One end of the control voltage output line 13 is connected to the output end of each of the switches sw4 that constitute the switch group 12121, and the other end thereof is connected to the base terminal of the transistor Tr2 of each of the current divider circuits 4.

The control logic circuit 13 outputs the control signals cnt10 to cnt19 for the switch group 122 and outputs the control signals cntl10 to cntl18 and cntl_b for the switch groups 1213 and 12121.

In the control voltage generation circuit 121 according to the first embodiment illustrated in FIG. 4, the voltage is divided by the resistors R4 connected in series between the connection lines 12. In order to provide 64-step switching, for example, 63 resistors R4 and 64 switches sw2 are necessary. In contrast, in the control voltage generation circuit 121 according to the third embodiment illustrated in FIG. 8, the voltage is divided in two stages. Accordingly, in a circuit capable of providing the same 64-step switching, the number of the resistors R8 and R9 can be decreased to 16, and the number of the switches sw3 and sw4 can be decreased to 40. Note that the switches sw3_1 to sw3_7 are four-pole switches, and therefore, each of the switches sw3_1 to sw3_7 is counted as four switches. Each of the switches sw3_0 and sw3_9 is counted as two switches.

As described above, according to the third embodiment, the control voltage generation circuit 121 is provided so as to divide the voltage in two stages. Therefore, a higher resolution can be provided to the control voltage, and the circuit scale can be reduced compared to the first embodiment.

In the above description, although the case is described where the control voltage generation circuit 121 according to the third embodiment illustrated in FIG. 8 is applied to the current division control circuit 12 according to the first embodiment, the control voltage generation circuit 121 according to the third embodiment may be applied to the current division control circuit 12 according to the second embodiment, and a similar effect can also be attained in this case.

Fourth Embodiment

The current division control circuit 12 according to the first to third embodiments generates the control voltage and the reference voltages in accordance with the voltage division using the resistors. Therefore, in a case where a large current flows into the current divider circuit 4, the base currents flow through the transistors Tr1 and Tr2 of the current divider circuit 4, and the error may become large. In a fourth embodiment, a configuration for correcting such a situation is described.

Figure 9:
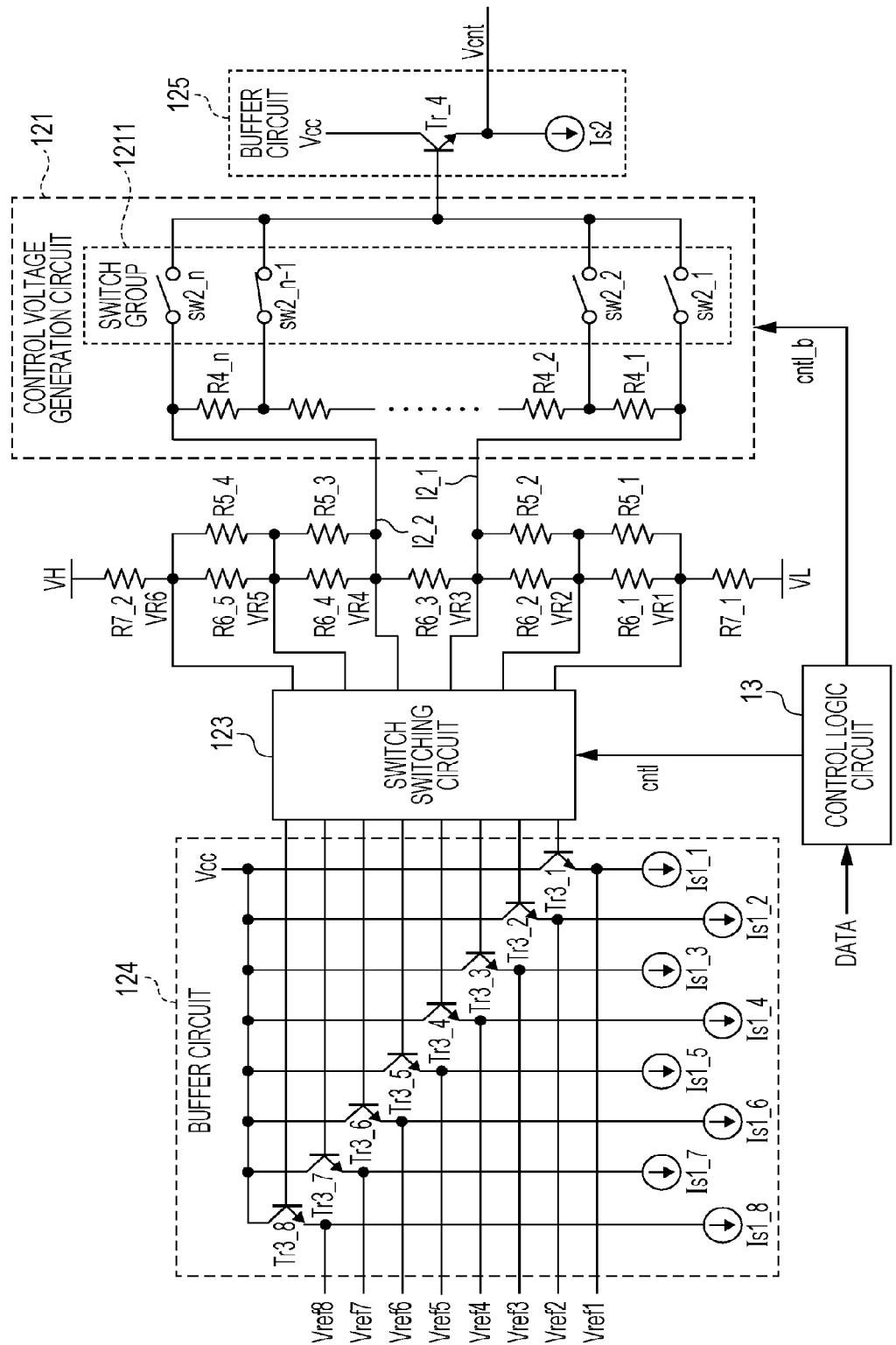
FIG. 9 is a diagram illustrating an example configuration of the current division control circuit in a fourth embodiment of the present invention.

FIG. 9 is a diagram illustrating an example configuration of the current division control circuit 12 according to the fourth embodiment of the present invention. The current division control circuit 12 according to the fourth embodiment illustrated in FIG. 9 is configured on the basis of the current division control circuit 12 according to the second embodiment illustrated in FIG. 6 and further includes buffer circuits 124 and 125. The components other than the buffer circuits 124 and 125 are similarly configured. Therefore, the components are similarly assigned the reference numerals, and description thereof is omitted.

The buffer circuit 124 is provided to output the reference voltages. The buffer circuit 124 includes a plurality of current sources Is1 (Is1$_{13}$ 1 to Is1_8) and a plurality of transistors Tr3 (Tr3_1 to Tr3_8), as illustrated in FIG. 9.

The current sources Is1 each supply a constant current.

Each of the transistors Tr3 has a base terminal that is connected to a corresponding one of the reference voltage output lines 11, an emitter terminal that is connected to a corresponding one of the current sources Is1, and a collector terminal to which a supply voltage Vcc is applied.

The buffer circuit 125 is provided to output the control voltage. The buffer circuit 125 includes a current source Is2 and a transistor Tr4, as illustrated in FIG. 9.

The current source Is2 supplies a constant current.

The transistor Tr4 has a base terminal that is connected to the output end of each of the switches sw1 that constitute the switch group 1211, an emitter terminal that is connected to the current source Is2, and a collector terminal to which the supply voltage Vcc is applied.

As described above, according to the fourth embodiment, the buffer circuits 124 and 125 are respectively provided to output the reference voltages and to output the control voltage. As a result, even in the case where a large current flows into the current divider circuit 4, the error can be reduced.

In the above description, although the case is described where the buffer circuits 124 and 125 are applied to the current division control circuit 12 according to the second embodiment, the buffer circuits 124 and 125 may be applied to the current division control circuit 12 according to the first embodiment, and a similar effect can also be attained in this case.

The above description is given while assuming a BGS-type photoelectric sensor that detects a detection object present at a distance less than a set distance to be the photoelectric sensor. However, the photoelectric sensor is not limited to a BGS-type photoelectric sensor. The embodiments of the present invention are also applicable to foreground suppression (FGS)-type photoelectric sensors that detect a detection object present at a distance more than a set distance.

In the present invention, the embodiments can be combined as desired, any components in the embodiments can be modified, or any components in the embodiments can be omitted within the scope of the present invention.

What is claimed is:

1. A photoelectric sensor having a detection range for a detection object set by using a set distance, the photoelectric sensor comprising:
    a multi-segment photodiode in which a plurality of photodiodes are arranged;
    a plurality of current divider circuits respectively connected to the plurality of photodiodes, each having a current division ratio set in accordance with a difference between a reference voltage and a control voltage; and
    a current division control circuit configured to sequentially set the reference voltage for each current divider circuit among the plurality of current divider circuits along one of arrangement directions of the photodiodes so that the reference voltage for the current divider circuit is equal to or larger than a voltage value of the reference voltage set for a current divider circuit in an immediately preceding stage among the plurality of current divider circuits, and set the control voltage, which is one common control voltage, for all of the plurality of current divider circuits, the common control voltage falling within a range that includes all of the reference voltages.

2. The photoelectric sensor according to claim 1, wherein the current division control circuit includes
    a plurality of reference voltage generation resistors connected in series between two voltages,
    a plurality of reference voltage output lines to output voltages divided by the reference voltage generation resistors as the reference voltages,
    a control voltage generation circuit that has a function of the reference voltage generation resistors and is configured to generate the control voltage that falls between connected voltages, and
    a switch group configured to replace one of the reference voltage generation resistors with the control voltage generation circuit.

3. The photoelectric sensor according to claim 2, wherein the current division control circuit further includes
    a plurality of resistors respectively connected in parallel to the reference voltage generation resistors.

4. The photoelectric sensor according to claim 1, wherein the current division control circuit includes
    a plurality of reference voltage generation resistors that are connected in series between two voltages,
    a control voltage generation circuit that is connected in series to or between the reference voltage generation resistors, and has a function of the reference voltage generation resistors and is configured to generate the control voltage that falls between connected voltages, and
    a switch switching circuit configured to distribute voltages divided by the reference voltage generation resistors and the control voltage generation circuit as the reference voltages for the respective current divider circuits.

5. The photoelectric sensor according to claim 4, wherein the current division control circuit further includes
    a plurality of resistors, one of the resistors being connected in parallel to the control voltage generation circuit, resistors among the resistors other than the one of the resistors being respectively connected in parallel to the reference voltage generation resistors.

6. The photoelectric sensor according to claim 2, wherein the control voltage generation circuit includes
    a plurality of control voltage generation resistors connected in series between the connected voltages, and
    a switch group configured to select one of voltages divided by the control voltage generation resistors as the control voltage.

7. The photoelectric sensor according to claim 2, wherein the control voltage generation circuit includes
    a plurality of first control voltage generation resistors connected in series between the connected voltages,
    a voltage divider circuit configured to generate the control voltage that falls between connected second voltages, and
    a switch group configured to replace one of the first control voltage generation resistors with the voltage divider circuit, wherein
    the voltage divider circuit includes a plurality of second control voltage generation resistors connected in series between the connected second voltages, and a switch group configured to select one of voltages divided by the second control voltage generation resistors as the control voltage.

8. The photoelectric sensor according to claim 2, wherein the current division control circuit further includes a buffer circuit configured to output the reference voltages, and a buffer circuit configured to output the control voltage.

\* \* \* \* \*